United States Patent
Cathey et al.

[11] Patent Number: 6,027,619
[45] Date of Patent: Feb. 22, 2000

[54] FABRICATION OF FIELD EMISSION ARRAY WITH FILTERED VACUUM CATHODIC ARC DEPOSITION

[75] Inventors: David A. Cathey; Jimmy J. Browning; Zhong-Yi Xia, all of Boise, Id.

[73] Assignee: Micron Technology, Inc., Boise, Id.

[21] Appl. No.: 08/769,936

[22] Filed: Dec. 19, 1996

[51] Int. Cl.[7] ............................................. C23C 14/32
[52] U.S. Cl. .................................. 204/192.38; 427/580
[58] Field of Search .................. 204/192.38, 298.41; 118/723 VE; 427/580

[56] References Cited

U.S. PATENT DOCUMENTS

| | | | |
|---|---|---|---|
| 4,645,895 | 2/1987 | Boxmann et al. | 204/192.38 |
| 4,842,710 | 6/1989 | Freller et al. | 204/192.38 |
| 4,877,505 | 10/1989 | Bergmann et al. | 204/298.41 |
| 5,013,578 | 5/1991 | Brown et al. | 204/192.38 |
| 5,279,723 | 1/1994 | Falabella et al. | 204/192.38 |
| 5,433,836 | 7/1995 | Martin et al. | 204/192.38 |
| 5,480,527 | 1/1996 | Welty | 204/192.38 |
| 5,580,429 | 12/1996 | Chan et al. | 204/192.38 |
| 5,652,083 | 7/1997 | Kumar et al. | 204/192.15 |

OTHER PUBLICATIONS

Sanders, David M., Boercker, David B. and Falabella, S., *IEEE Transaction on Plasma Science*, vol. 18, No. 6, Dec. 1990, Coating Technology Based on the Vacuum Arc–A Review, pp. 883–894.

Busta, Heinz H., "*Micromech, Microeng.* (1992)," Review—Vacuum microelectronics—1992, pp. 43–73.

*Primary Examiner*—Nam Nguyen
*Assistant Examiner*—Rodney G. McDonald
*Attorney, Agent, or Firm*—Hale and Dorr LLP

[57] ABSTRACT

A filtered cathodic vacuum arc is used as a source of metal to generate a highly directional beam of metal ions having substantially larger velocity parallel to the axis of the beam (perpendicular to the surface of the target) than perpendicular to the axis of the beam. This ion beam, with energies ranging up to 80 eV, is used to deposit metal into the bottom of high aspect (typically greater than 3 to 1) openings, for example, to deposit titanium in the bottom of deep contact holes in semiconductor devices or to deposit molybdenum to form tips for emitters for a field emission display. Gases can be introduced into the vacuum deposition chamber during deposition to change the nature of the deposit. The substrate or target bias can be adjusted to control the deposition rate.

16 Claims, 3 Drawing Sheets

FABRICATION OF FIELD EMISSION ARRAY WITH FILTERED VACUUM CATHODIC ARC DEPOSITION

GOVERNMENT RIGHTS

This invention was made with Government support under Contract No. DABT63-93-C-0025, awarded by the Advanced Research Projects Agency (ARPA). The Government has certain rights in this invention.

BACKGROUND OF THE INVENTION

The present invention relates to a method and apparatus for depositing metal into high aspect openings using a cathodic vacuum arc as a source of metal ions. Typically, the metal is deposited to create field emission display tips or deep contacts on a substrate. When used in the production of field emission tips, the tips are fabricated using the Spindt technique with the tip deposition step performed via the cathodic arc.

Coatings produced by traditional physical vapor deposition (PVD) techniques, such as electron-beam evaporation and magnetron sputtering, are adequate for some purposes. However, as explained in U.S. Pat. No. 5,279,723 to Falabella et al., the disclosure of which is incorporated herein by reference, there are increasing instances where coatings produced by a PVD technique have inadequate stoichiometry, adhesion, or density and are too isotropic. In the case of high aspect openings, sputtering can result in the opening being pinched off rather than becoming coated throughout its entire depth.

Ion-based coating methods provide the ability to control the directionality of the ions. Ion sources involving vacuum arc-based processes may overcome the difficulties of the PVD techniques by providing copious quantities of ions of virtually any conductive material. The ion beam can be highly directional thus eliminating the need for the filters used in sputtering systems. Vacuum arc coating techniques generally involve use of either an anodic arc or a cathodic arc. Unfortunately, cathodic arcs normally produce droplets of material called "macro-particles" which cause blemishes in the resulting coatings. An example of one system directed toward removing these macro-particles can be found in U.S. Pat. No. 5,279,723.

Field emitter arrays have been formed using the "Spindt" technique in which a metal, such as molybdenum, is evaporated into a masked hole in a electric. The evaporated metal is first filtered in order to form a very directional (or anisotropic) beam of material.

The known filtering techniques have had limited application in mass production because of cost and efficiency. They have been generally difficult to perform over large areas and the filter has required frequent cleaning and/or changing in order to remove build up.

SUMMARY OF THE INVENTION

In accordance with the present invention, tips, such as for cathode emitters of a field emission display, are fabricated using the "Spindt" technique. The tip deposition step is performed by a cathodic arc. Also, deep contacts on a substrate can be formed in accordance with the present invention.

A filtered cathodic vacuum arc is used as a source of metal to generate highly directional beam of metal ions. The ions have substantially larger velocity parallel to the axis of the beam (perpendicular to the surface of the target) than perpendicular to the axis of the beam. This ion beam, with energies typically ranging up to 80 eV, can be used to deposit metal into the bottom of a high aspect (e.g., greater than three to one) opening or to form a field emitter tip. For example, this process could be used to deposit titanium in the bottom of a deep contact in semiconductor devices. In addition, nitrogen can be introduced into the vacuum deposition chamber during the titanium deposition to form a titanium nitride deposit. As another example, this process could be used to deposit molybdenum to form a field emitter tip. The substrate or target bias can be adjusted to control the deposition rate.

The present invention uses a filtered cathodic vacuum arc ion source coupled to a macro-particle filter, using a curved magnetic field, to generate a highly ionized, anisotropic beam of metal ions and to guide this ion beam to a target. The particle filter consists of a curved magnetic field which prevents line-of-sight from the arc to the part to be coated, yet provides a path for the ions to flow. The filter also includes a plurality of annular disks that form baffles attached to the inner walls to trap the macro-particles. The baffles prevent the macro-particles from rebounding off the walls and reaching the vacuum deposition chamber, where they may adversely affect the deposition. This ion beam is of sufficient density of uniform particle size that it can be used to deposit metal to form emitter tips on finite structures, such as field emission displays, or deep contacts on a substrate. By controlling the energy of the substrate, the highly directional metal ion beam can be used to rapidly form an array of emitter tips over a large area.

The beam of metal ions is highly directional and highly ionized when it comes from the cathodic arc. The directionality is as high as 10 to 1 (velocity parallel to the axis of the beam relative to perpendicular velocity), and the percentage ionization of the metal is greater than 95%. The ratio of vertical deposition to horizontal deposition is typically greater than 4 to 1. The high directionality allows the metal to deposit at the bottom of a contact hole without creating a deposit at the opening. A deposit at the opening can pinch off the top of the hole, preventing the desired deposit at the bottom of the hole. The deposition rate is fast (e.g., greater than 1 $\mu$m/min), which provides a short process time. This deposition rate is much faster than with conventional e-beam deposition or evaporation, which cannot be easily filtered and does not provide a high deposition rate, and is much faster than standard ion beams, which do not have enough beam current for fast deposit. The deposition tends to be uniform (e.g., the variation may be as low as 2–3%) over a large area (e.g., 1 square meter). The uniformity can be adjusted by altering the electric and magnetic field strengths.

BRIEF DESCRIPTION OF THE DRAWINGS

The present invention will now be described, by way of example, with reference to the accompanying drawings in which.

DETAILED DESCRIPTION OF A PREFERRED EMBODIMENT

Figure 1:
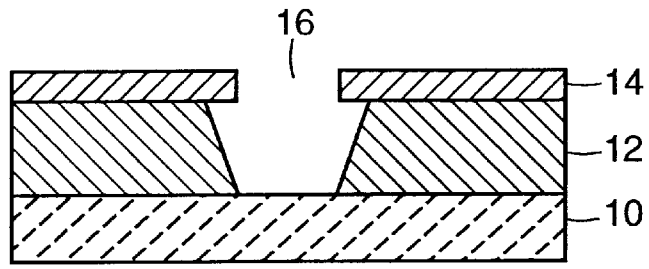
FIGS. 1 to 4 diagrammatically show the steps for forming a "Spindt" emitter.

Referring first to FIGS. 1 to 4, a processing sequence for forming a "Spindt" emitter array starts with a silicon substrate 10 on which is formed an approximately 1.5 $\mu$m thick oxide layer 12, such as silicon dioxide ($SiO_2$). An approximately 0.4 $\mu$m thick molybdenum layer 14 is deposited on top of the oxide. Electron beam evaporation is then used to form gate holes 16 through molybdenum layer 14 ranging from approximately 0.4 to 2 $\mu$m in diameter, depending on the desired turn-on voltage of the device. The silicon dioxide underneath the holes is then etched in a HF solution. Because the silicon dioxide layer etches vertically as well as horizontally, the molybdenum gate layer 14 is undercut. The cross section of the device after these initial processing steps is shown in FIG. 1.

Figure 2:
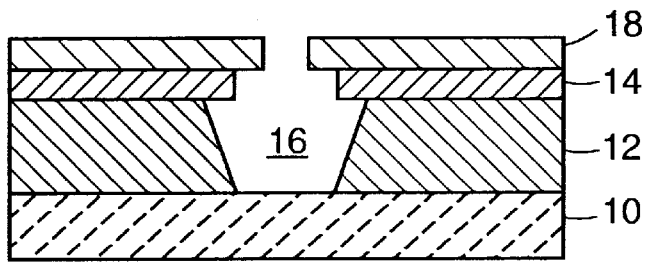

Next the substrate 10 is mounted in a vacuum chamber (not shown) and rotated about an axis perpendicular to its surface. A sacrificial layer 18 of aluminum is deposited. The diameter of the hole 16 can be adjusted to a desired dimension by adjusting the amount of aluminum that is deposited. The cross section of the device after this processing step is shown in FIG. 2.

Figure 3:
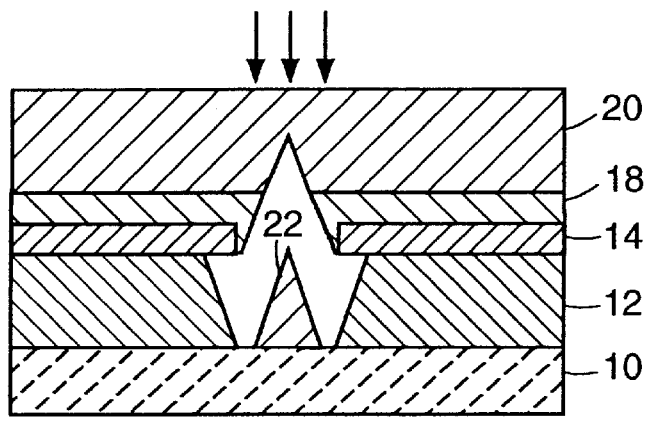

Next, a layer 20 of molybdenum is deposited by electron beam evaporation in order to form the field emission tip. The size of the hole 16 decreases with increasing thickness of the molybdenum layer 20. A cone 22, with a sharp point, grows inside the hole 16. Considerable control of the cone height, angle and tip radius is obtained by choice of the starting size of hole 16, the thickness of the oxide layer 12, and the distance of the evaporation source (not shown) from the substrate. FIG. 3 shows the device after cone formation, the direction of the ion beam represented by several parallel arrows.

Figure 4:
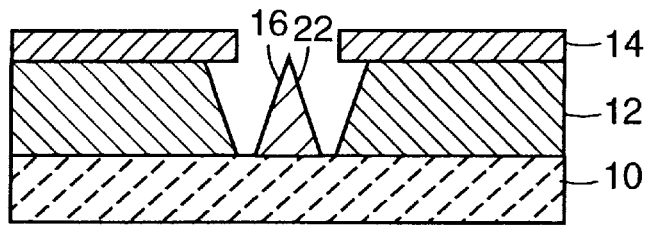

The final step is to etch the sacrificial layer of aluminum 18, thereby removing the molybdenum film 20 that forms on top of the gate. The final device is shown in FIG. 4.

By depositing the cone through the gate orifice, the tips of the emitters are self-aligned with the gate. The described "Spindt" device is an example of a first group of devices utilizing deposition techniques. Available technology uses a small area evaporation source with a shadow mask as a filter to obtain the anisotropic deposition required to form the tip. If the deposition is not directional, the hole may fill completely and a sharp tip will not form. This will particularly be the case if the deposition method is prone to the generation of macro-particles of the coating material or if the beam is not sufficiently directional or uniform.

Figure 6:
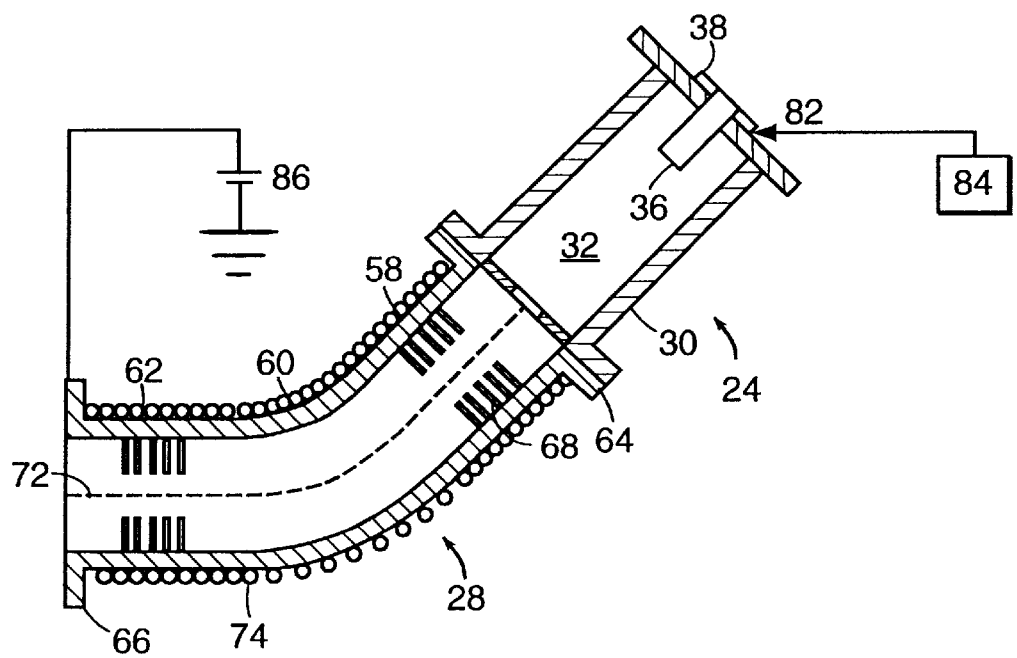
FIG. 6 is a detailed schematic, partly in section, of a cathodic arc ion source and magnetic separation duct for carrying out the present invention.
Figure 5:
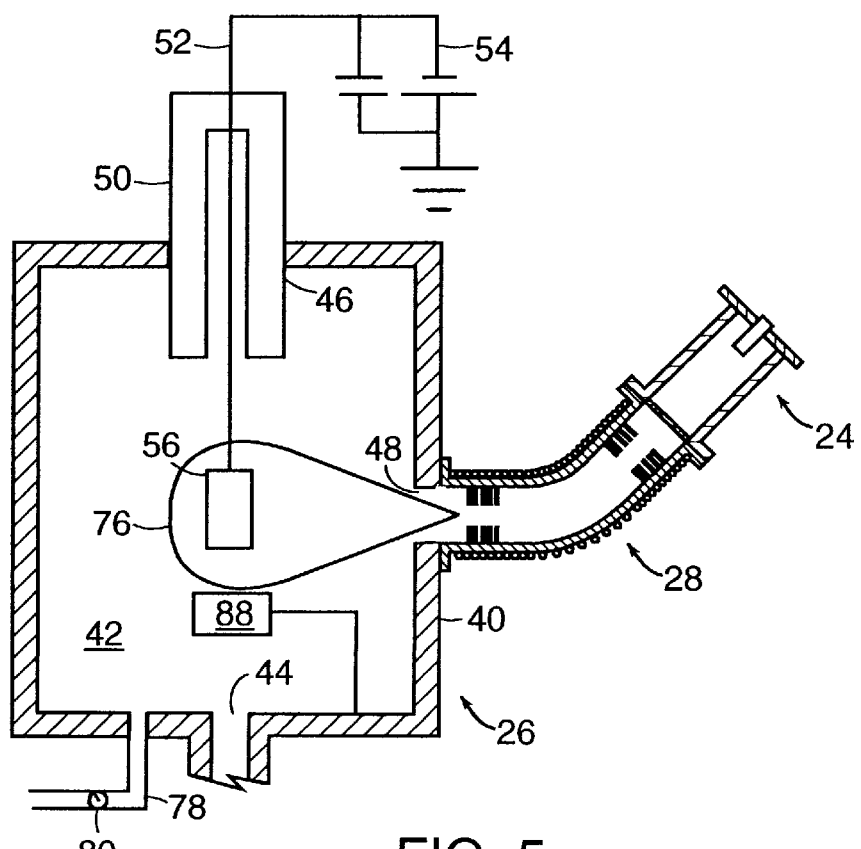
FIG. 5 is a schematic diagram of a cathodic arc ion deposition apparatus according to an embodiment of the present invention.

Referring to FIGS. 5 and 6, an embodiment of the present invention has been schematically illustrated utilizing a curved magnetic field connecting an ion source to the target or substrate to be coated. The ion source may be used, for example, in the tip deposition step of the Spindt technique, described above, or to form deep contacts on a substrate in a high aspect ratio hole.

A cathodic arc source, generally indicated by 24, is connected to a vacuum deposition chamber, generally indicated by 26, by a curved or bent magnetic duct assembly 28. The source 24 comprises a housing 30 forming a chamber 32 therein. At opposite ends of chamber 32 are positioned an anode assembly 34 and a cathode assembly 36. Both assemblies are of known construction and include cooling means (not shown) and power connections 82. A power control 84 permits adjustment of the potential applied to cathode assembly 36. The cathode assembly 36 contains a cathode formed from the material to be deposited. An arc starter 38 may be provided. Preferably, anode assembly 34 is a metal ring. The normal seals and other conventional structural features of an arc source have not been shown for sake of simplicity of the drawings.

The vacuum deposition chamber 26 is a closed housing 40 defining a chamber 42, vacuum port 44, bias port 46, one or more plasma ports 48 (one is shown, for clarity), and gas inlet port 78. The vacuum port 44 is connected to any known means (not shown) for creating a vacuum within chamber 42. Preferably the vacuum within the chamber is in the range of $10^{-5}$ to $10^{-7}$ Torr. The bias port 46 is provided with an insulated feed-through 50 including a conductor 52, one end of which is connected to a voltage source 54 and the other end of which is suspended in chamber 42 to support target holder 56. Target holder 56 may be fixed or movable. Each plasma port 48 aligns one end of a magnetic duct assembly 28 with the target holder 56. The gas inlet port 78 includes valve 80 and permits a vapor or a gas, such as nitrogen, to be introduced into chamber 42. Heater 88 is positioned within vacuum position chamber 26 to permit the heating of a target on target holder 56.

The magnetic duct assembly 28 comprises a straight cylindrical entrance section 58, an intermediate arcuate section 60, and a straight cylindrical exit section 62. Preferably, magnetic duct assembly 28 provides an approximately 45 degree bend between entrance section 58 and exit section 62 and, with power supply 86, is positively biased relative to the cathode in the range of 10–50 volts. The positive bias produces an electric field within the duct assembly, which helps to increase the directionality of the plasma generated in the cathodic arc source. Preferably, the potential applied to the duct assembly is adjustable. Sections 58 and 62 have mounting flanges 64, 66, respectively.

The angle in duct assembly 28 prevents line-of-sight between the arc and the target, and serves as a macro-particle filter. First and second baffles 68, 70 of nonmagnetic material, such as stainless steel, are fixed in the respective entrance and exit sections 58, 62 to define an axial passage, noted by the broken line 72. Preferably, there are between 5 and 10 annular discs in each baffle 68 and 70, with the discs spaced approximately 0.5 to 2 cm apart. The particular number, spacing and specific location of the discs and baffles 68, 70 depends, for example, on the single-bounce pattern of macro-particles from the arc target or cathode. Preferably, the baffles are configured so as to prevent macro-particles from reaching vacuum chamber 42 and the parts to be coated. Preferably, the annular discs of baffles 68, 70 have aligned axial apertures in the range of 3–10 cm in diameter. Helical coil 74, which is wound around the outside of duct assembly 28, is connected to a power source (not shown). Coil 74 produces an axial magnetic field through duct assembly 28 to direct the plasma generated in the cathodic arc source. Preferably, the magnetic field through duct assembly 28 is adjustable (e.g., by controlling the power applied to coil 74), with an axial magnetic field strength from approximately 500 Gauss to 5 KiloGauss.

In a preferred embodiment, the present invention utilizes this cathodic vacuum arc metal source to perform tip-formation deposition or to form deep contacts. Preferably, the main arc between the cathode and anode is initiated by a short duration discharge in the range of 1000 to 2000 volts. The cathode material, such as molybdenum or titanium, is then evaporated and ionized by the self-sustained arc plasma. The plasma 76 can stream through duct assembly 28 while the macro particles are collected by baffles 68, 70. At the exit of duct assembly 28, a very highly ionized, high density plasma 76 of cathode material is available for deposition. The density of the plasma can be varied by changing the power applied to the cathodic arc. The cathodic arc source may be operated in a DC or in a pulsed mode.

It is preferred to control the substrate, or target, bias relative to the source during the deposition. Making the substrate more negative has the effect of increasing beam energy and directionality. This can be used to further enhance deposition in deep or high aspect holes and to affect the sharpness of the tips. The energy of the beam (which is typically 50 to 80 eV) can also affect the adherence and structure of the metal-silicon interface. The quality of the deposit, including the density and resistivity, can be close to that of the bulk material. As the metal is deposited, the substrate can be biased more positive, thereby decreasing the beam energy and making it less directional. With, for example, deep contacts, this allows the ion beam to begin to fill the hole up, or pinch it off. With the formation of tips, sweeping the bias of the substrate can be used to control the shape and size of the tip. In general, control of the deposition directionality can be tailored to provide the most desired deposition geometry. In the case of titanium on silicon, the substrate can be heated with heater 88 during or after the deposition to form titanium silicide.

If gases or vapors are introduced through gas inlet 78 into the vacuum deposition chamber along with the ion beam, the deposited material can be changed. For example, when depositing titanium to form deep contacts, nitrogen can be introduced into the chamber in order to form a titanium nitride deposit. Titanium nitride provides adherence between tungsten and a titanium-silicon interface, which contains silicon dioxide. In the case of a cathodic arc, the nitride could be deposited after titanium is deposited or after titanium silicide is formed by heating. Thus several different process steps can be accomplished rapidly by a single apparatus.

Heater 88 may be used to heat a target on target holder 56 during or after deposition of the metal ions.

Through the use of multiple arc sources and high ionization rate, different material depositions and/or chemical reactions may be introduced into the process to form different compounds and material layers at different stages of tip form deposition. Also, the system can be scaled up by using multiple arc sources or by applying more power to the cathodic arc source. For example, a low work function layer (i.e. a layer of material with a work function less than the material of which the tip is made) may be formed on top of the tip to obtain a field emission display with a high electron emission current and low turn on voltage.

Figure 7:
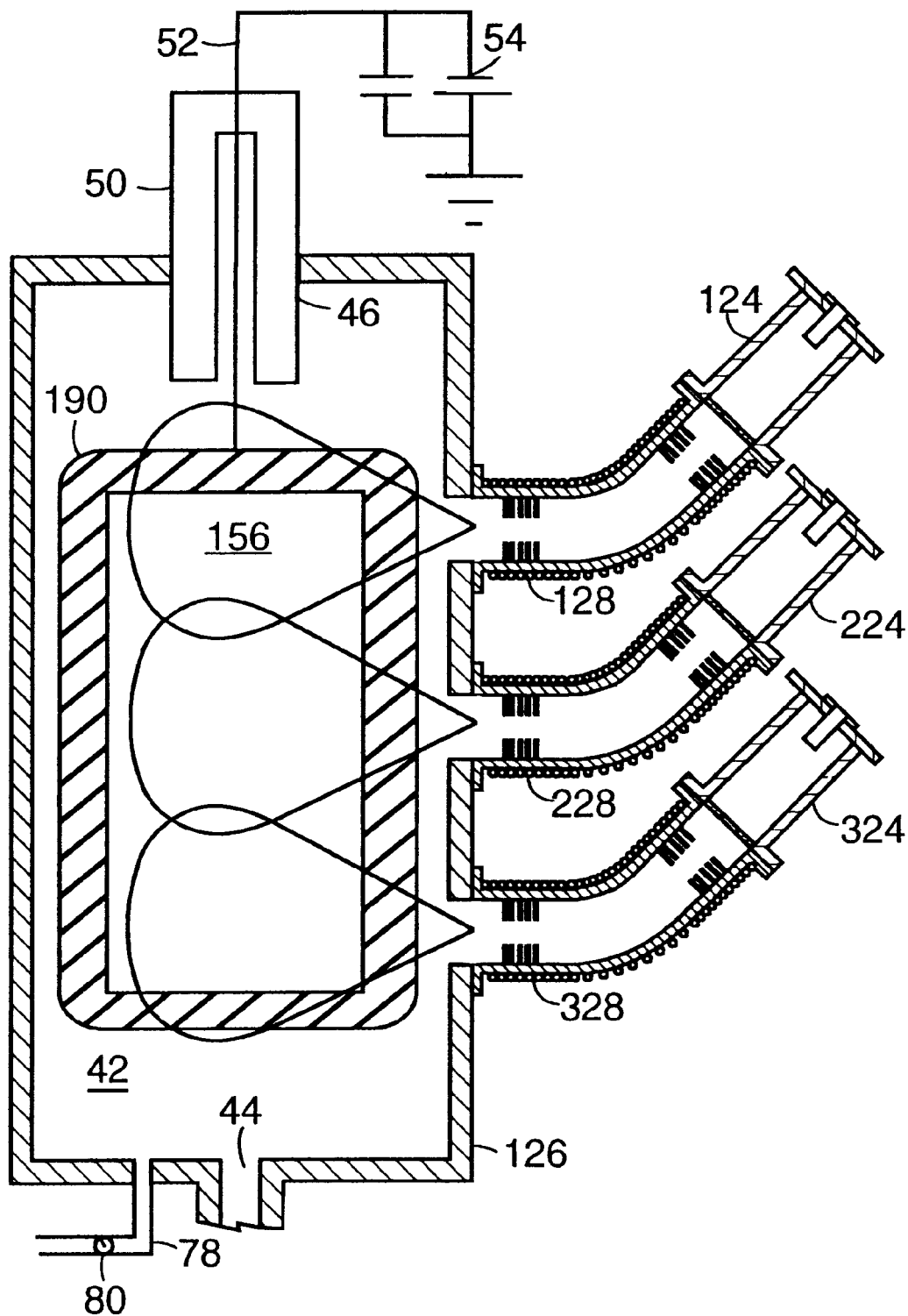
FIG. 7 is a schematic diagram of a cathodic arc ion deposition apparatus according to another embodiment of the present invention.

The use of multiple arc sources is illustrated in FIG. 7. Preferably, each arc source 124, 224, and 324 is connected to its own duct assembly, 128, 228, and 328, respectively, with duct assemblies 128, 228, and 328 leading to vacuum deposition chamber 126. The arc sources may be arranged in any desired pattern to provide the necessary uniformity. Optionally, as shown in FIG. 7, arc sources 124, 224, and 324 are arranged in a linear formation, and a large target holder 156 may then be moved across the plasma path (e.g., on a conveyor belt 190) to coat a substrate larger than could be covered at one time.

The present invention may be subject to many modifications and changes without departing from the spirit or essential characteristics thereof. The present embodiment should therefore be considered in all respects as illustrative and not restrictive of the scope of the invention as defined by the appended claims.

We claim:

1. A method of forming an emitter tip on a surface of a target, the method comprising:
    (a) providing a first chamber, a second chamber, and a duct, said duct providing a non-linear path between said first chamber and said second chamber;
    (b) providing a target having a surface that defines at least one hole;
    (c) providing an ion source;
    (d) placing the target in said first chamber;
    (e) placing said ion source in said second chamber;
    (f) establishing a vacuum in said first chamber, said second chamber, and said duct;
    (g) generating a beam of ions, said beam extending from said ion source in said first chamber into said duct, said beam being characterized by a directionality, said directionality equaling a ratio of a parallel velocity to a perpendicular velocity, said parallel velocity being a velocity of ions in said beam measured in a direction substantially parallel to an axis of said beam, said perpendicular velocity being a velocity of ions in said beam measured in a direction substantially perpendicular to said axis of said beam;
    (h) generating a magnetic field proximal the duct, the magnetic field causing at least some of the ions in the beam to travel along said non-linear path through said duct into said second chamber;
    (i) providing one or more baffles within said duct;
    (j) depositing at least some ions traveling in said beam onto the surface at the bottom of said hole; and
    (k) after depositing said at least some ions at the bottom of said hole, reducing said directionality of said beam and thereby forming a conical emitter tip at the bottom of the hole.

2. A method according to claim 1, wherein reducing said directionality of said beam comprises varying the potential difference between the surface and the ion source.

3. A method according to claim 1, further comprising providing at least one more ion source and depositing ions from the at least one more ion source onto the surface.

4. A method according to claim 3, further comprising depositing more than one material onto the surface.

5. A method according to claim 1, further comprising introducing gases or vapors into the vacuum chamber.

6. A method according to claim 1, further comprising depositing a sacrificial layer of aluminum on the surface before the step of depositing the ions.

7. A method according to claim 6, further comprising etching the sacrificial layer of aluminum after the step of depositing the ions.

8. A method according to claim 1, wherein the ion source comprises a cathode and power source applied to the cathode, the method further comprising applying power from the power source to the cathode in a DC or pulsed mode.

9. A method according to claim 1, further comprising moving the surface through the ion beam.

10. A method of forming an emitter tip on a surface of a target, the method comprising:
    (a) providing a first chamber, a second chamber, a third chamber, a first duct and a second duct, said first duct providing a first non-linear path between said first chamber and said second chamber, said second duct providing a second non-linear path between said first chamber and said third chamber;

(b) providing a target having a surface that defines a plurality of holes;

(c) providing a first ion source and a second ion source;

(d) placing the target in said first chamber;

(e) placing said first ion source in said second chamber and said second ion source in said third chamber;

(f) establishing a vacuum in said first chamber, said second chamber, said third chamber, said first duct and said second duct;

(g) generating a first beam of ions, said first beam extending from said first ion source in said second chamber into said first duct;

(h) generating a first magnetic field proximal said first duct, the first magnetic field causing at least some of the ions in said first beam to travel along said first non-linear path through said first duct into said first chamber, (i) providing one or more baffles within said first duct, said baffles blocking particles not traveling in said first non-linear path;

(j) generating a second beam of ions, said second beam extending from said second ion source in said third chamber into said second duct;

(k) generating a second magnetic field proximal said second duct, the second magnetic field causing at least some of the ions in said second beam to travel along said second non-linear path through said second duct into said first chamber;

(l) providing one or more baffles within said second duct, said baffles blocking particles not traveling in said second non-linear path; and (m) depositing ions from said first and second beams onto said surface and forming an emitter tip at a bottom of each of said holes.

11. A method according to claim 10, further comprising moving the surface through said first and second ion beams.

12. A method according to claim 10, further comprising applying a potential difference between the surface and the ion source.

13. A method according to claim 12, further comprising varying the potential difference between the surface and the ion source.

14. A method of forming an emitter tip on a surface of a target, the method comprising:

(a) providing a first chamber, a second chamber, a third chamber, a first duct and a second duct, said first duct providing a first non-linear path between said first chamber and said second chamber, said second duct providing a second non-linear path between said first chamber and said third chamber;

(b) providing a target having a surface that defines a plurality of holes;

(c) providing a first ion source and a second ion source;

(d) placing the target in said first chamber;

(e) placing said first ion source in said second chamber and said second ion source in said third chamber;

(f) establishing a vacuum in said first chamber, said second chamber, said third chamber, said first duct and said second duct;

(g) generating a first beam of ions, said first beam extending from said first ion source in said second chamber into said first duct, said first beam being characterized by a first directionality, said first directionality equaling a ratio of a first parallel velocity to a first perpendicular velocity, said first parallel velocity being a velocity of ions in said first beam measured in a direction substantially parallel to an axis of said first beam, said perpendicular velocity being a velocity of ions in said first beam measured in a direction substantially perpendicular to said axis of said first beam;

(h) generating a first magnetic field proximal said first duct, the first magnetic field causing at least some of the ions in said first beam to travel along said first non-linear path through said first duct into said first chamber;

(i) providing one or more baffles within said first duct;

(j) generating a second beam of ions, said second beam extending from said second ion source in said third chamber into said second duct, said second beam being characterized by a second directionality, said second directionality equaling a ratio of a second parallel velocity to a second perpendicular velocity, said second parallel velocity being a velocity of ions in said second beam measured in a direction substantially parallel to an axis of said second beam, said perpendicular velocity being a velocity of ions in said second beam measured in a direction substantially perpendicular to said axis of said second beam;

(k) generating a second magnetic field proximal said second duct, the second magnetic field causing at least some of the ions in said second beam to travel along said second non-linear path through said second duct into said first chamber;

(l) providing one or more baffles within said second duct, said baffles blocking particles not traveling in said second non-linear path;

(m) depositing ions from said first and second beams onto said surface at a bottom of said holes; and (n) after depositing ions from said first and second beams at a bottom of said holes, reducing said first and second directionalities of said beams and thereby forming an emitter tip in each of said holes.

15. A method according to claim 14, wherein reducing said first and second directionalities comprises applying a positive electrical bias to said surface.

16. A method according to claim 14, further comprising moving the surface across said first and second beams.

* * * * *

UNITED STATES PATENT AND TRADEMARK OFFICE
CERTIFICATE OF CORRECTION

PATENT NO. : 6,027,619
DATED : February 22, 2000
INVENTOR(S) : Cathey et al.

It is certified that error appears in the above-identified patent and that said Letters Patent is hereby corrected as shown below:

Claim 1, column 6,
Line 29, after the words "providing one or more baffles within said duct, "please add -- , said baffles blocking particles not traveling in said non-linear path --.

Signed and Sealed this

Second Day of October, 2001

Attest:

*Nicholas P. Godici*

NICHOLAS P. GODICI
*Attesting Officer*  *Acting Director of the United States Patent and Trademark Office*